(12) United States Patent
Yudasaka et al.

(10) Patent No.: US 6,765,265 B2
(45) Date of Patent: Jul. 20, 2004

(54) SYSTEM AND METHOD FOR MANUFACTURING A THIN FILM TRANSISTOR

(75) Inventors: Ichio Yudasaka, Suwa (JP); Mitsutoshi Miyasaka, Suwa (JP); Piero Migliorato, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/936,040

(22) PCT Filed: Jan. 2, 2001

(86) PCT No.: PCT/GB01/00007

§ 371 (c)(1),
(2), (4) Date: Dec. 11, 2001

(87) PCT Pub. No.: WO01/50538

PCT Pub. Date: Jul. 12, 2001

(65) Prior Publication Data

US 2003/0080337 A1 May 1, 2003

(30) Foreign Application Priority Data

Jan. 7, 2000 (GB) .............................. 0000376

(51) Int. Cl.[7] .............................................. H01L 29/01
(52) U.S. Cl. .......................... 257/347; 257/59; 257/72; 257/403
(58) Field of Search ................................ 257/347, 349, 257/373, 376, 402, 403, 59, 72

(56) References Cited

U.S. PATENT DOCUMENTS

| | | | | |
|---|---|---|---|---|
| 5,142,344 A | * | 8/1992 | Yamazaki | .................. 357/23.7 |
| 5,365,080 A | | 11/1994 | Yamazaki et al. | |
| 5,382,537 A | | 1/1995 | Noguchi | |
| 5,498,904 A | | 3/1996 | Harata et al. | |
| 5,578,865 A | * | 11/1996 | Vu et al. | ..................... 257/611 |

(List continued on next page.)

FOREIGN PATENT DOCUMENTS

| | | | |
|---|---|---|---|
| EP | 735 592 | * | 10/1996 |
| JP | 57 099778 A | | 6/1982 |
| JP | 01-25573 | * | 1/1989 |
| JP | 64-25573 | * | 1/1989 |
| JP | 4267536 A | | 9/1992 |
| JP | 6029320 A | | 2/1994 |
| JP | 6-196501 | * | 6/1994 |
| JP | 7288227 A | | 10/1995 |
| JP | 8028520 B | | 3/1996 |
| JP | 9289166 A | | 11/1997 |
| JP | 10 012886 A | | 1/1998 |
| JP | 10-79513 | * | 3/1998 |
| JP | 11087243 A | | 3/1999 |
| JP | 2000-114529 | * | 4/2000 |
| JP | 2000228361 A | | 8/2000 |

*Primary Examiner*—Nathan J. Flynn
*Assistant Examiner*—Ahmed N. Sefer
(74) *Attorney, Agent, or Firm*—Oliff & Berridge, PLC

(57) ABSTRACT

The present invention provides a thin film transistor (TET) and its production method which enable the stabilizing of saturation current and improving reliability by improving the film quality of the channel region. The TFT includes a channel region towering over a gate electrode through a gate insulation film, a source region connecting to the channel region and a drain region connecting to the channel region on an opposite side of the source region are formed on the polycrystal semiconductor film on which island-like patterning is performed. An indented section is formed on a surface of the channel region, and the section corresponding to the indented section becomes a recombination center which captures the small-number carrier (holes) because the degree of the crystallization is low in the section corresponding to the indented section due to shift from the optimum conditions at the time of laser annealing of the semiconductor.

12 Claims, 18 Drawing Sheets

U.S. PATENT DOCUMENTS

| | | | |
|---|---|---|---|
| 5,821,563 A | * 10/1998 | Yamazaki et al. | 257/66 |
| 5,893,730 A | 4/1999 | Yamazaki et al. | |
| 5,942,856 A | * 8/1999 | Koyama | 315/169.3 |
| 6,023,088 A | * 2/2000 | Son | 257/347 |
| 6,034,408 A | * 3/2000 | Ghoshal | 257/467 |
| 6,064,091 A | * 5/2000 | Deane et al. | 257/347 |
| 6,232,622 B1 | * 5/2001 | Hamada | 257/67 |
| 6,337,500 B1 | * 1/2002 | Nakaoka et al. | 257/349 |
| 6,480,179 B1 | * 11/2002 | Akimoto | 345/92 |
| 6,528,830 B1 | * 3/2003 | Lui et al. | 257/200 |

* cited by examiner

LASER ANNEALING

↓ ↓ LASER ANNEALING ↓ ↓

SYSTEM AND METHOD FOR MANUFACTURING A THIN FILM TRANSISTOR

The present invention relates to a thin film transistor (hereafter TFT). In particular it relates to a manufacturing technology for improving the transistor characteristics of the TFT.

The various apparatuses which use TFTs include an active matrix substrate of a liquid crystal display which is formed on a transparent substrate such as a glass plate, and the near central region is designated to be the screen display region 81 as shown in FIG. 12 (A). In this screen display region 81, pixels are formed in blocks by data line 90 and scanning line 91 which are made of metal film, silicide film and conductive semiconductor film of aluminum, tantalum, molybdenum, titanium and tungsten. In each pixel, liquid crystal units 94 (liquid crystal cell) to which image signals are input through TFT 30 for pixel switching are formed. For data line 90, a data side driving circuit 60 with a shift register 84, a label shifter 85, a video line 87, and an analog switch 86 are formed. For the scanning line 91, a scanning side driving circuit 79 with a shift register 88 and the label shifter 89 are formed. In each pixel, a storage capacitor 40 is formed between the scanning line 91 and the capacity line 92 extending parallel to the scanning line 91, which storage capacitor 40 possesses a function to raise maintenance characteristics of the electric charge at the crystal unit 94. Sometimes, the storage capacitor 40 may be formed between the aforementioned scanning line 91 and the pixel electrode.

A CMOS circuit is formed by an N-type TFT 10 and a P-type TFT 20 in the data-side and the scanning-side circuits 60 and 70 as described in FIG. 12 (B). Such CMOS circuit forms an inverter circuit having more than one step in the driving circuits 60 and 70.

Hence, three types of TFT consisting of an N-type TFT 10 for a driving circuit, a P-type TFT 20 for a driving circuit and an N-type TFT 30 for pixel switching on the surface side of the substrate in the active matrix substrate 200. However, the basic structure is common to these TFTs 10, 20 and 30. Hence, to avoid redundancy of description, only the structure and the production method of the N-type TFT for a driving circuit will be described using FIGS. 13, 14, 15 and 16.

On the active matrix substrate 200, a bottom layer protection film 51 made of silicon oxide film is formed on the surface side of the substrate 50, and a polycrystal semiconductor film 100 is formed in island-like pattern on the surface of the bottom layer protection film 51. A gate insulation film 12 is formed on the surface of the semiconductor film 100 and a gate electrode 14 is formed on the surface of the gate insulation film 12. The channel region 15 is formed, through the gate insulation film 12, in the area of the gate electrode 14 towering in the semiconductor film 100. A highly concentrated source region 16 and a highly concentrated drain region 17 are formed on both sides of the channel region 15 being self-aligned with respect to the gate electrode 14. A source electrode 41 and a drain electrode 42 are electrically connected respectively to the highly concentrated source region 16 and the highly concentrated drain region 17 through the contact holes of the inter-layer insulation film 52.

In order to produce the TFT 10 with above structure, first, a substrate 50 made of glass, etc. which is cleansed by super sound wave cleansing is prepared in FIG. 14 (A).

Next, as described in FIG. 14 (B), a bottom layer protection film 51 is formed covering entire surface of the substrate 50 under temperature conditions of about 150° C. to 450° C. substrate temperature.

Next, as described in FIG. 14 (C), a semiconductor film 100 is formed on the surface of the bottom layer protection film 51, during which time, heat deformation of the glass substrate 50 is prevented by applying a low temperature process. The low temperature process is a process in which the maximum temperature of the process (the maximum temperature to which the entire substrate reaches simultaneously) is below about 600° C. (preferably below about 500° C.). On the other hand, a high temperature process is a process in which the maximum temperature of the process (the maximum temperature to which the entire substrate reaches simultaneously) is more than about 600° C. Film formation under high temperature or heat oxidation of silicon is a high temperature process of 700° C. to 1200° C.

However, during a low temperature process, formation of polycrystal semiconductor film directly on the substrate is impossible, hence, first non-crystal semiconductor film 100 is formed using a plasma CVD method or low pressure CVD method, and then the semiconductor film 100 is crystallized as described below. The SPC method (Solid Phase Crystallization) or RTF method (Rapid Thermal Annealing) may be considered as a method of crystallization to be used here. However, with the application of laser annealing (ELA: Excimer Laser Annealing/crystallization process) in which XeCl excimer laser beam is irradiated, as described in FIG. 14 (D), a rise in the substrate temperature is prevented and polycrystal Si with large granule diameter is obtained.

In this crystallization process, a laser beam (excimer laser) from the laser beam source 320 is irradiated, through the optical system 325, towards the substrate 50 being mounted on the stage 310 as described in FIG. 15, for example. During this process, the line beam L0 with the irradiation region L being longer in X-direction (for example, the line beam with laser pulse repeat frequency of 200 Hz) is irradiated on the semiconductor film 100, and the irradiation region L is shifted in Y-direction. Here, the beam length of the line beam L0 is 400 mm with an output intensity being 300 mJ/cm$^2$, for example. Moreover, in shifting the irradiation region L of the laser beam, the line beam is scanned in such a manner that the section equivalent to 90% of the peak value of the laser intensity in the width direction overlaps for each region. As a result, non-crystal semiconductor film 100 fuses once and is polycrystallized after a cooling solidification process. During this process, because the irradiation time of the laser beam on each region is very short and because the irradiation region is local compared to the entire substrate, simultaneous heating of the entire substrate 50 with high temperature does not occur. For this reason, heat deformation or cracks are prevented for the glass substrate being used as the substrate 50, though the glass substrate is inferior to the quarzt substrate in heat resistance.

Next, island-like patterning is performed on the polycrystal semiconductor film 100 using a photo lithography technique, as described in FIG. 14(E).

Then, a gate insulation film 12 made of silicon oxide film is formed with respect to the surface side of the semiconductor 100, as described in FIG. 16(A).

Next, a conductive film 140 containing aluminum, tantalum, molybdenum, titanium and tungsten is formed by a sputter method as described in FIG. 16(B).

Then a gate electrode 14 is formed by patterning the conductive film 140, as described in FIG. 16 (D), after forming a resist mask 301 on the surface of the conductive film 140 as described in FIG. 16 (C).

Next, phosphate ions with dosage of about $10^{15}$ cm$^{-2}$, for example, are knocked-in with respect to semiconductor film 100 using the gate electrode 14 as a mask. As a result, the highly concentrated source region 16 and drain region 17 with an impurity concentration of about $10^{20}$ cm$^{-3}$ are formed on the semiconductor film 100 being self-aligned with respect to the gate electrode 14. The section of the semiconductor film 100 where impurities are not introduced becomes the channel region 15.

Next, annealing is performed for activation after the formation of the inter-layer insulation film 52, as described in FIG. 13. Then, the source electrode 41 and the drain electrode 42 are formed after formation of contact holes in the inter-layer insulation film 52.

In the N-type TFT with aforementioned structure, a positive drain voltage is applied on the drain electrode 42 and a positive gate voltage is applied on the gate electrode 14 for the electric potential of the source electrode 16, as described in FIG. 17 (A). As a result, negative electric charges are concentrated on the interface between the channel region 15 and the gate insulation film 12, and the N-type channel 151 (reverse layer) is formed. If the drain voltage is sufficiently smaller than the gate voltage during this process, due to a connection of the source region 16 to the drain region 17 at the channel 151, the drain current increases rapidly (non-saturation region) with the rise of the drain voltage as shown by real line L0 in the transistor characteristics (current-voltage characteristics) in FIG. 18.

On the other hand, as the drain voltage rises nearly to the gate voltage, the electron density being induced becomes small and pinch-off phenomena occurs in the vicinity of the drain region 17, as described in FIG. 17(B). In this state, even if the drain voltage is further increased, the drain current does not increase but reaches a nearly constant state (saturation region) as described by the real line L0 in FIG. 18. The value of the current at this time is called a saturation current. For this reason, if the TFT 10 is driven using this saturation current, a constant drain current is obtained and the destruction of the TFT 10 itself and the circuit in the vicinity due to excess current may be prevented.

As described above, the transistor characteristics, basically, are controlled only by the behavior of multiple carriers (electrons in the case of the N-type and holes in the case of the P-type). However, if the drain voltage rises, a phenomena occurs in which aforementioned drain current, which is supposed to be constant, rises abnormally high (kink effect), with a possibility of the occurrence of bipolar action in some cases.

Of these phenomena, the kink effect causes the following problems. First, if the drain voltage increases in the TFT and the electric field between source region and drain region becomes stronger, the carriers are accelerated by this electric field and begin to possess large energy. The carriers are accelerated in the direction from the source region 16 to the drain region 17, possessing the maximum energy in the vicinity of the drain region 17. The carriers with large energy (hot carriers) collide with atoms composing the semiconductor film or impure atoms, and generate a pair of an electron and a hole. The hole being generated increases the voltage of the channel region 15 and lowers the threshold voltage, causing an increase in the current between source region and drain region. As a result, in a TFT of the prior art, the drain current increases rapidly with the rise of the drain voltage as described by the broken line in FIG. 18, which may cause destruction of the TFT itself or of circuits in the vicinity. Moreover, such phenomena becomes more frequent with an increase in the level of on-current of the TFT 10 through an increase in the crystallization level of the semiconductor 100, hence in the TFT 10 of the prior art the reliability tends to drop as the on-current level increases.

Moreover, the bipolar action causes the following problem. First, when the barrier between the channel and the source region becomes large with a further increase in the voltage of the channel region 15, the current flows from the channel region 15 to the source region, triggering a flow of an even larger current between the source region and the drain region. Hence, in such phenomena the channel region 15 may be considered as a base, the source region 16 as an emitter and the drain region 17 as a collector respectively. In other words, the current caused by the hole flowing from the channel region 15 to the source region 16 may be considered as base current, while the current flowing between the source region 16 and the drain region 17 may be considered collector current corresponding to the current flowing from the channel region 15 to the source region 16.

In short, the aim of the present invention is to provide a TFT and its production method with stable saturation current and improved reliability by improving the film quality of the channel region.

In order to resolve aforementioned problems, a thin film transistor of the present invention is of the type wherein channel regions which tower through the gate insulation film in the gate electrode and source drain regions connected to said channel regions are formed against a semiconductor film being formed on the surface of an insulation substrate, and recombination centers which capture carriers are formed in said channel regions by part of crystal semiconductor films with relatively low degree of crystallization among crystal semiconductor films forming said channel regions.

In the TFT of the present invention, the channel region 15 towering over the gate electrode 14 through the gate insulation film 12 and the source region 16 and the drain region 17 connecting the channel region 15 are formed from the semiconductor film 100 which is formed on the surface of the insulation substrate 50, and the recombination center 150 which captures small-number carriers using a section with a relatively low degree of crystallization, is formed in the channel region 15, as described in the basic conceptualization of FIG. 17 (D). In such a TFT (an N-type TFT, for example), even if a pair of a hole and an electron is generated by the hot carrier with an increase in drain voltage, the hole and electron are recombined and captured at the recombination center 150 formed in the channel 15. For this reason, the electric potential of the channel region 15 does not increase and the threshold voltage does not drop. Moreover, the hole density of the channel region 15 does not increase as much as placing of holes into the source region 16, hence the placing of the electrons from the source region 16 into the channel region 15 caused by the placing of the holes do not occur. Hence, there is no change in saturation current. For this reason, in the TFT of the present invention the drain current does not increase substantially, even if the drain voltage changes in the saturation region as indicated by the dotted line L2 or the broken line L3 in FIG. 18. As a result, the destruction of the TFT itself and circuits in the vicinity thereof by excess current may be prevented and reliability may be improved.

In the present invention, the recombination center is preferably concentrated in the vicinity of the drain region within the aforementioned channel region. In fact, the recombination center is preferably concentrated in the region whose distance from the drain region is suited to about 1/3 to 1/10 of the channel length within said channel region.

In the present invention, the region where said recombination center is concentrated may be formed as a section in which the film thickness is different from other regions among the channel regions.

In the present invention, the region where said recombination center is concentrated may be formed as a section in which the position of the surface height is different from other regions among the channel regions.

In the present invention, in order to form the region where said recombination center is concentrated as a section in which the position of the surface height is different from other regions among the channel regions, a structure in which the thickness of the semiconductor film forming said channel region is made to differ partially may be applied.

Moreover, in forming the region where said recombination center is concentrated as a section in which the position of the surface height is different from other regions among the channel regions, an indentation section or bulged section may be formed beforehand in the lower layer of the semiconductor film forming said channel region.

In the present invention, in the manufacturing method of the thin film transistor with the channel region towering over the gate electrode through the gate insulation film and the source region and the drain region connecting the channel region being formed for the semiconductor film which is formed on the surface of the insulation substrate, a section with a relatively low degree of crystallization is formed in a predetermined region of said semiconductor film by performing laser annealing on said semiconductor film after forming the semiconductor film for forming said channel region.

In the present invention, a section with a relatively low degree of crystallization may be formed in a predetermined region of said semiconductor film by performing laser annealing on said semiconductor film after forming the semiconductor film with partially different film thickness as the semiconductor film for forming said channel region.

In the present invention, a section with a relatively low degree of crystallization may be formed in a predetermined region of said semiconductor film by performing laser annealing on said semiconductor film after forming the semiconductor film with a different surface height as the semiconductor film for forming said channel region.

In the present invention, a method in which the thickness of said semiconductor film may be partially changed may be used in order to form the aforementioned semiconductor film with a different surface height.

In the present invention, an indentation section or a bulged section may be formed beforehand in the lower layer side of said semiconductor film in order to form the aforementioned semiconductor film with a different surface height.

Embodiments of the present invention will now be described by way of further example only and with reference to the accompanying drawings, in which:

FIG. 1 is a cross-section illustrating a typical TFT structure of embodiment 1 of the present invention.

FIGS. 2(A)–(E) are process cross-sections of the TFT production method shown in FIG. 1.

FIGS. 3(A)–(E) are cross-sections illustrating each process performed after the processes shown in FIG. 2 of the TFT production method in FIG. 1.

FIG. 4 is a cross-section illustrating a typical TFT structure of embodiment 2 of the present invention.

FIGS. 5(A)–(F) are process cross-sections of the TFT production method shown in FIG. 4.

FIGS. 6(A)–(D) are cross-sections illustrating each process performed after processes shown in FIG. 5 of the TFT production method in FIG. 4.

FIGS. 7(A)–(D) are cross-sections illustrating a typical TFT structure and the production method of a modification of embodiment 2 in the present invention.

FIG. 8 is a cross-section illustrating a typical TFT structure of embodiment 3 of the present invention.

FIGS. 9(A)–(F) are process cross-sections of the TFT production method shown in FIG. 8.

FIGS. 10(A)–(D) are cross-sections illustrating each process performed after processes shown in FIG. 9 of the TFT production method in FIG. 8.

FIGS. 11(A)–(D) are cross-sections illustrating a typical TFT structure and the production method of a modification of embodiment 3 in the present invention.

FIGS. 14(A)–(E) are process cross-sections of the TFT production method in the prior art.

Figure 15:
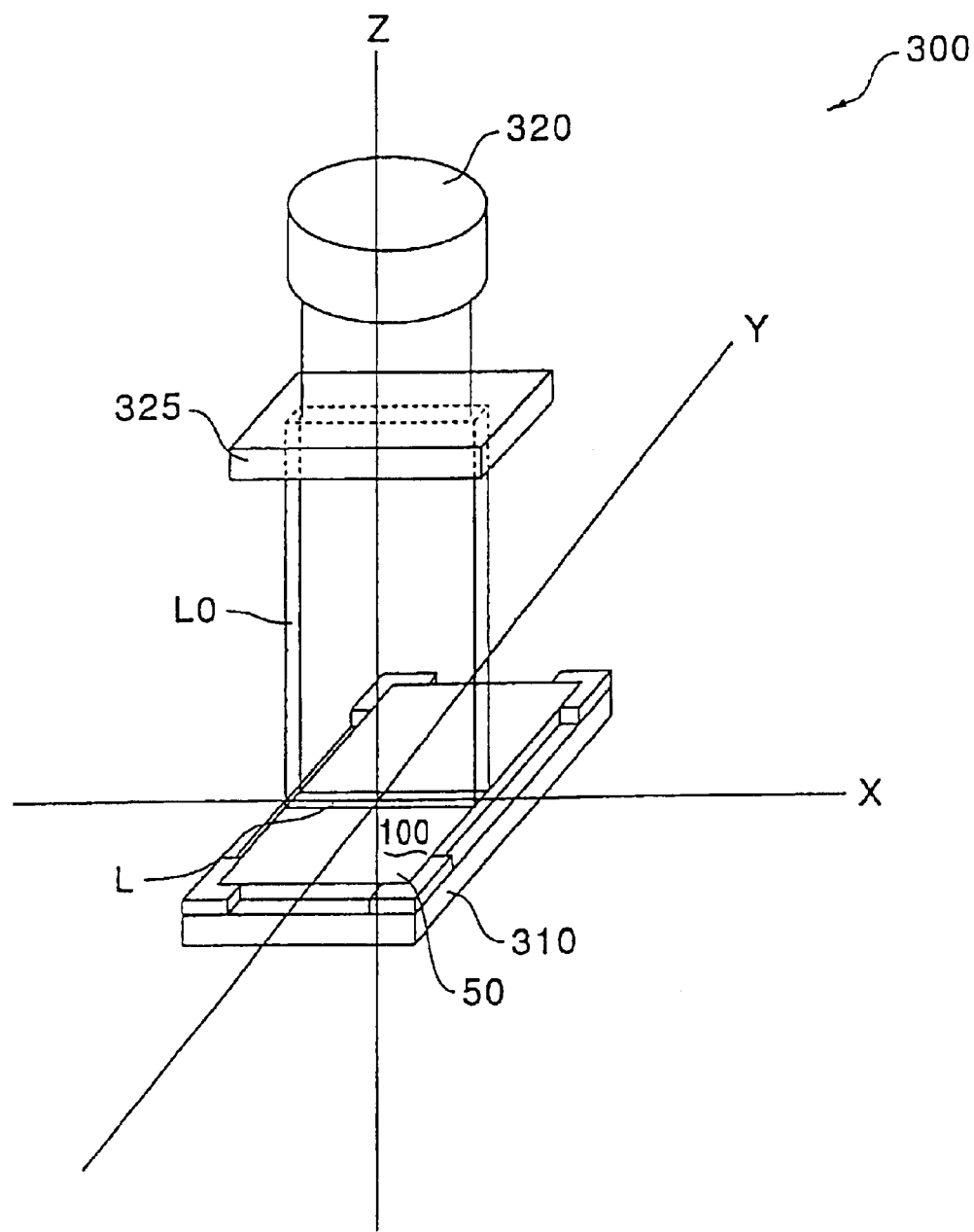
Figure 16A:
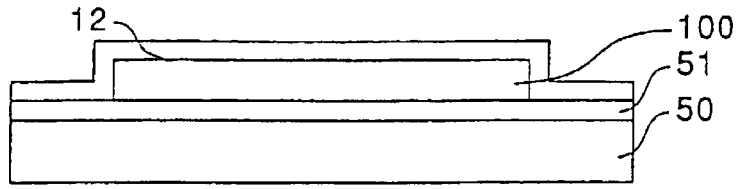
Figure 16B:
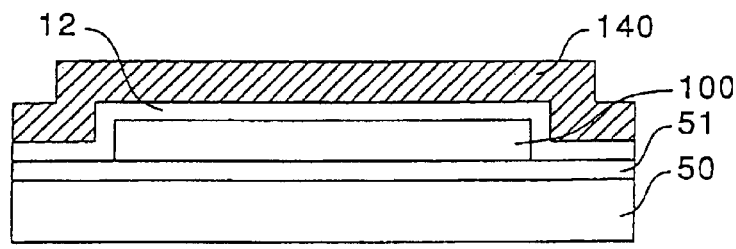
Figure 16C:
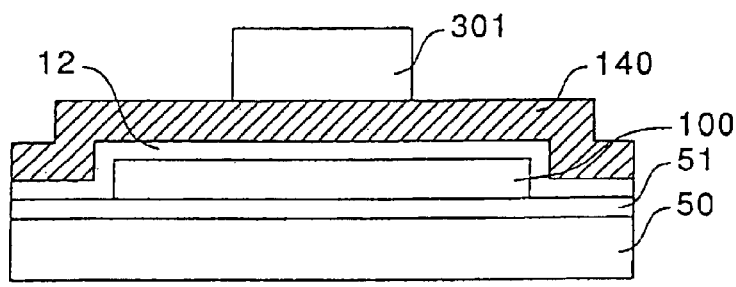
Figure 16D:
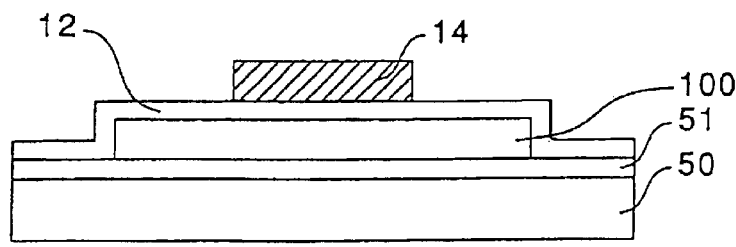
Figure 16E:
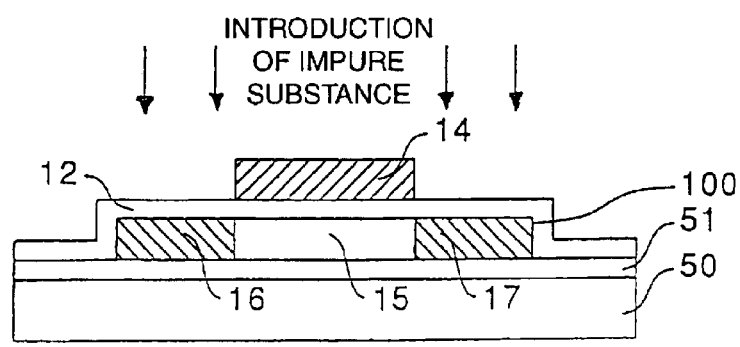
Figure 17A:
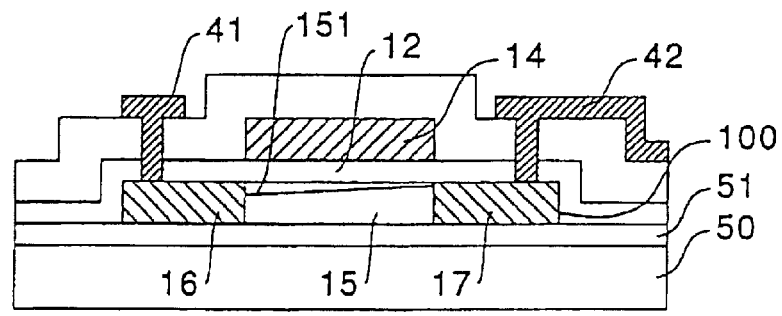
Figure 17B:
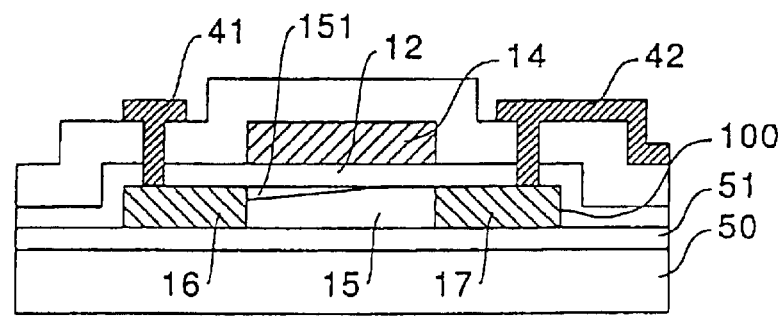
Figure 17C:
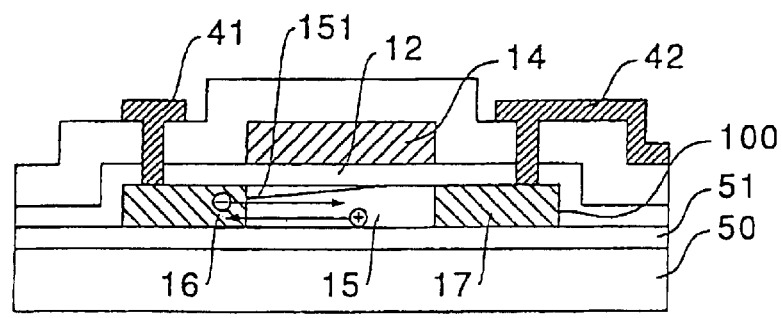
Figure 17D:
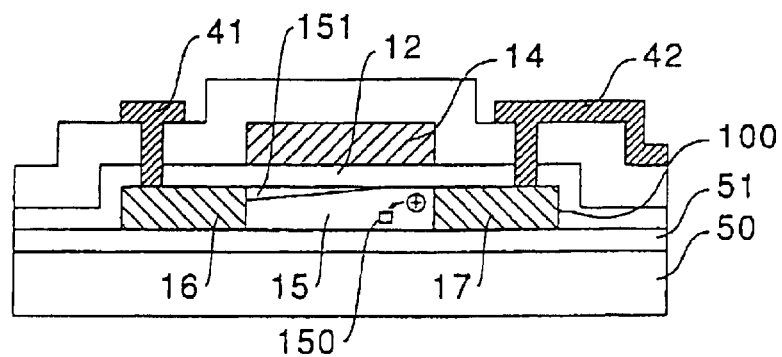

FIG. 15 is a schematic structure diagram of a laser annealing apparatus used in laser annealing (crystallization process).

Figure 13:
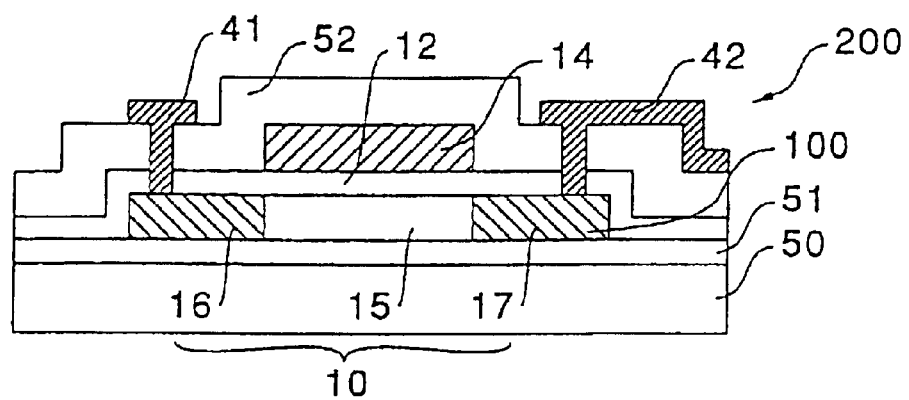
FIG. 13 is a cross-section illustrating a typical TFT structure in the prior art.
Figure 14A:
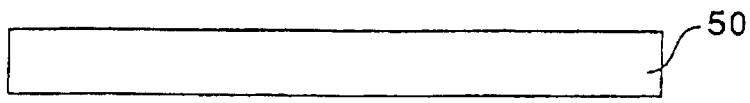
Figure 14B:
Figure 14C:
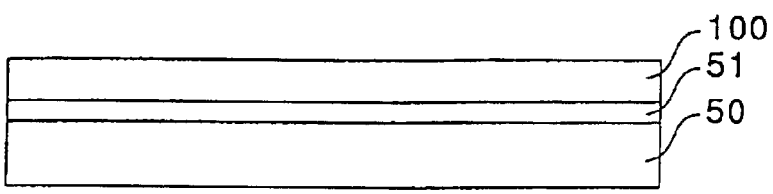
Figure 14D:
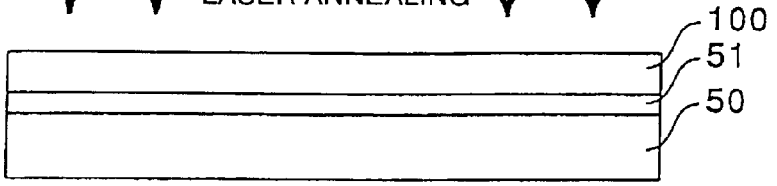
Figure 14E:
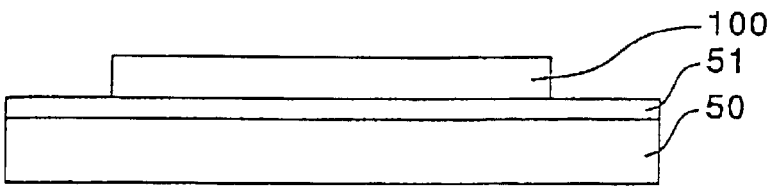

FIGS. 16(A)–(E) are cross-sections illustrating each process performed after processes shown in FIG. 14 of the TFT production method in FIG. 13.

FIGS. 17(A)–(D) are illustrations describing operation of a TFT.

Figure 18:
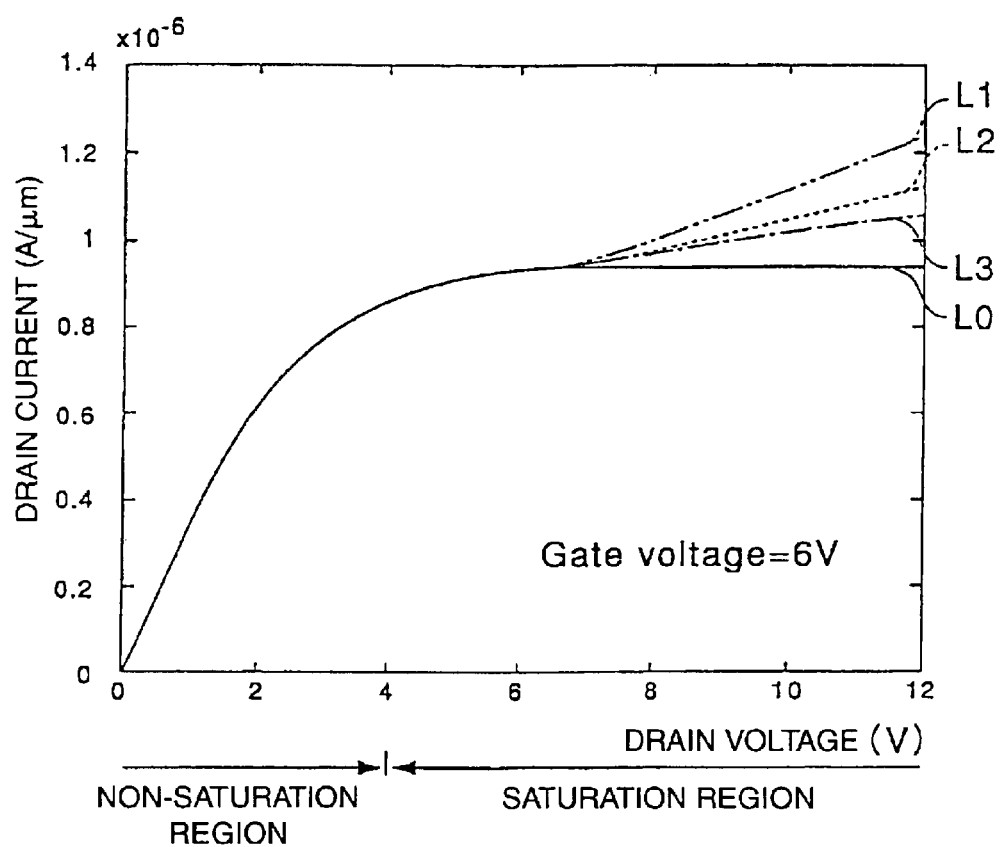

FIG. 18 is a graph describing results of a simulation of the transistor characteristics of a TFT to which present invention is applied, a TFT of the prior art and a model TFT.

Next, embodiments of the present invention will be described with reference to the drawings. In each embodiment to be described below, a TFT is formed for use in pixel switching or in the driving circuit in an active matrix substrate for use in a liquid crystal display apparatus. Hence, as described in the prior art, three types of TFT consisting of the N-type TFT for use in the driving circuit, the P-type TFT for use in the driving circuit and the N-type TFT for use in the pixel switching should have been formed on the same substrate. However, these TFTs have a common basic structure. Moreover, TFTs for which the present invention is applied should have a common basic structure with the TFTs of the prior art. Hence, in order to avoid redundancy, the elements which are common to the TFTs in the prior art and to the production method are identified with the same symbols, and only the structure and the production method of the N-type TFT for use in the driving circuit will be described in the following explanation.

Embodiment 1

Figure 1:
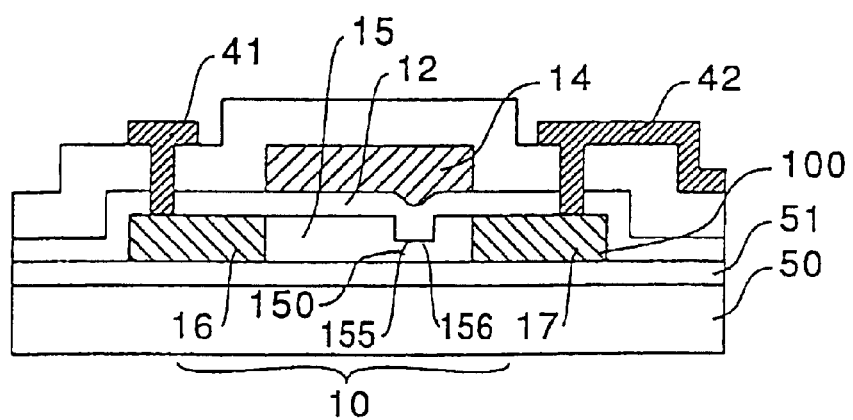

FIG. 1 is a cross-section illustrating a typical structure of a TFT in embodiment 1 of the present invention.

In the present embodiment, a bottom layer protection film 51 made of silicon oxide film is formed on the surface side of the substrate 50, and an N-type TFT 10 is formed on the surface of the bottom layer protection film 51, as described in FIG. 1. The semiconductor film 100 consisting of polycrystal silicon film with island-like pattern is formed on the surface of the bottom layer protection film 51. A gate insulation film 12 consisting of silicon oxide film or silicon nitride film is formed on the surface of the semiconductor film 100, and the gate electrode 14 is formed on the surface of the gate insulation film 12. A channel region 15 facing the gate electrode 14 through the gate insulation film 12 is formed in the semiconductor film 100. A highly concentrated source region 16 and drain region 17 which are self aligned with respect to the electrode 14 are formed on both sides of the channel region 15. The source electrode 41 and the drain electrode 42 are electrically connected to the source region 16 and the drain region 17 respectively through contact holes in the inter-layer insulation film 52 consisting of a silicon oxide film.

Here, the surface of the channel region 15, out of the entire semiconductor film 100, is partially indented and the indentation section 155 has a thinner film thickness than other sections in the channel region 15.

The section corresponding to the indentation section 155 in the channel region 15 of the TFT 10 thus structured becomes the recombination center 150 which captures a small-number carrier, having a lower degree of crystallization and having more defects than other regions in the channel 15. In the present embodiment, the recombination center 150 is concentrated at the position closer to the drain region 17 in the channel region 15. In other words, the recombination center 150 is concentrated at the position whose distance from the drain region 17 is equivalent to $1/3$ to $1/10$ of the channel distance.

The density of the recombination center 150 in the present embodiment is in the range of $1 \times 10^{13}$ cm$^{-3}$ to $1 \times 10^{20}$ cm$^{-3}$, and the carrier capture cross section of the recombination center 150 is in the range of $1 \times 10^{-13}$ cm$^2$ to $1 \times 10^{-20}$ cm$^2$. Such density and carrier capture cross section of the recombination center 150 may be controlled by how far the degree of crystallization is lowered in the production method, which will be explained later.

Transistor characteristics (current-voltage characteristics) of TFT 10 thus structured will be described in reference to FIG. 1, FIG. 17 (D) and FIG. 18. FIG. 17 (D) provides an explanation of operation of a TFT to which the present invention is applied. FIG. 18 is a graph describing the result of simulating transistor characteristics of a TFT to which the present invention is applied, a TFT in the prior art, and a model TFT.

In FIG. 18, the characteristics of a TFT, out of TFTs to which the present invention is applied, which is formed with the thickness of semiconductor 100 being 460 angstroms, the channel length of 8 μm, the recombination center 150 being 2 μm in length and being away from the drain region 17 by a distance of 1 μm are represented by dotted line L2 and broken line L3. The carrier capture cross section of charged recombination center 150 and the carrier capture cross section of neutral recombination center 150 of TFTs represented by dotted line L2 out of these two TFTs are respectively $1 \times 10^{-13}$ cm$^2$ and $1 \times 10^{-15}$ cm$^2$. On the other hand, the carrier capture cross section of charged recombination center 150 and the carrier capture cross section of the neutral recombination center 150 of the TFT represented by broken line L3 out of these two TFTs are respectively $1 \times 10^{-12}$ cm$^2$ and $1 \times 10^{-14}$ cm$^2$. The charged recombination center 150 here is the recombination center 150 which normally has negative electric charge and becomes neutral upon capturing a hole. On the other hand, the neutral recombination center 150 is normally neutral and changes to positive electric charge upon capturing a hole. Moreover, the density of the recombination center 150 of both TFTs represented by dotted line L2 and broken line L3 is set at $1 \times 10^{19}$ cm$^{-3}$.

The source region 16 and the drain region 17 of TFT 10 thus structured are connected at the channel when the drain voltage is sufficiently smaller than the gate voltage, hence, the drain current increases as the drain voltage increases (non-saturated region) as described by real line L2 and L3 in FIG. 18.

Moreover, as the drain voltage increases sufficiently close to the gate voltage, a pair of a hole and an electron is generated by the hot carrier. The hole being generated recombines and is captured at the recombination center 150 as described in FIG. 17 (D). Thus, most of the holes being generated disappear in the channel region 15 and the electric potential of the source region 16 does not rise at the channel region 15. Hence, the threshold voltage of the channel region 15 does not drop. Moreover, a phenomena in which electrons are placed from the source region 16 to the channel region 15 by holes being placed from the channel region 15 to the source region 16 does not occur. Hence, in TFT 10 of the, present embodiment, the kink effect in which drain current increases greatly and the occurrence of bipolar action in a saturated region may be controlled as described by dotted line L2 and broken line L3 in FIG. 18. Hence, even if the degree of crystallization of the semiconductor film 100 is raised to improve the on-current level, the TFT itself or circuits in vicinity will not be destroyed by excess current, resulting in an improvement of reliability.

Figure 2:
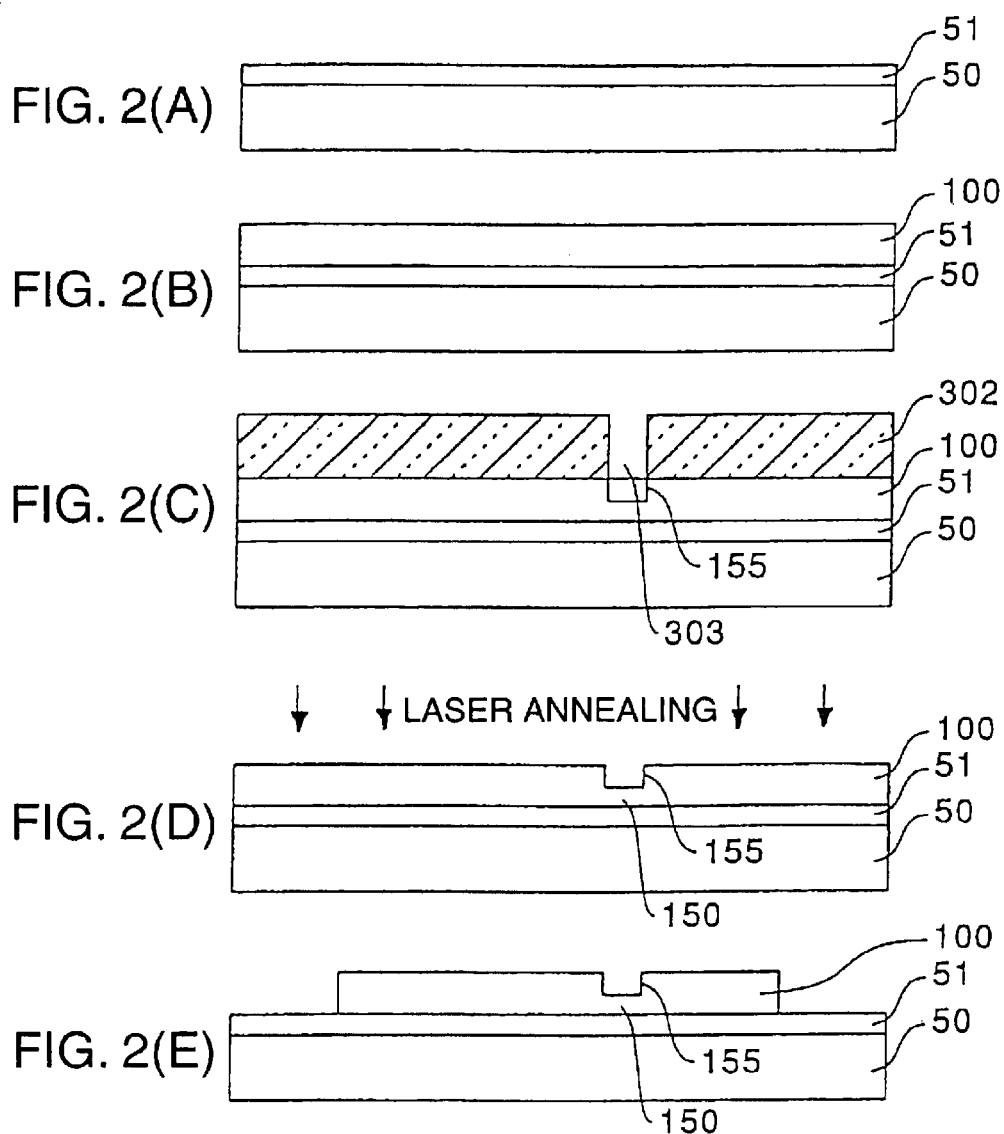
Figure 3:
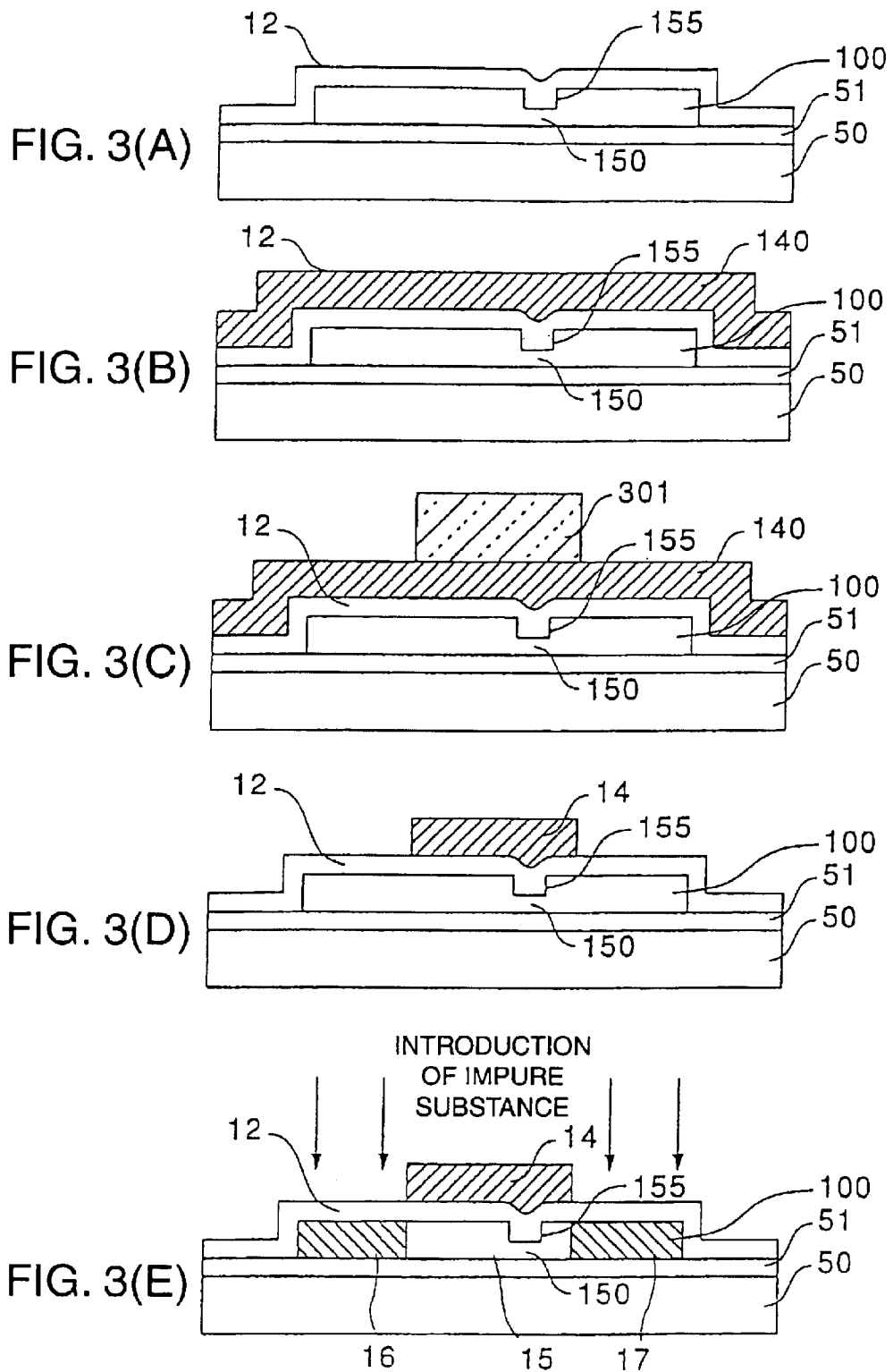

A method for manufacturing of TFT 10 thus structured will be described with reference to FIG. 1, FIG. 2 and FIG. 3. Both FIG. 2 and FIG. 3 are process cross-sections illustrating the method for manufacturing of the TFT of the present embodiment.

In the present embodiment, a substrate 50 made of glass, etc. which is cleansed by ultrasonic cleaning, or such is first prepared as described in FIG. 2(A).

Next, a bottom layer protection film 51 consisting of silicon oxide film of a thickness of 2000 to 5000 angstroms is formed by the plasm CVD method on the entire surface of the substrate 50 under substrate temperatures of about 150° C. to 450° C. Mixtures of monosilane and laughing gas or TEOS (tetraetoxysilane) and oxygen may be used as the raw material gas in this case.

Next, as described in FIG. 2(B), semiconductor film 100 is formed on the substrate 50. In this case, heat deformation of substrate 50 which is made of glass is prevented using a low temperature process. In other words, the semiconductor film 100 consisting of non-crystal silicon film with thickness 300 to 700 angstroms is formed by the CVD method over the entire surface of the substrate 50 under a substrate temperature of about 150° C. to 450° C. Disilane or monosilane may be used as the raw gas in this case (film formation process). Here, the reduced pressure CVD method, EB vaporization method or sputter method may be used instead of the plasm CVD method for forming the non-crystal semiconductor film 100 on the substrate 50 under a low temperature condition.

Next, as described in FIG. 2(C), a resist mask 302 is formed on the surface of semiconductor film 100 using a photolithography technique. In this resist mask 302, an opening 303 is provided in the section corresponding to the indentation 155 which was described using FIG. 1.

A light etching is performed on the surface of the semiconductor film 100 on which resist mask 302 is formed in a manner described above. The surface of the semiconductor film 100 at the section corresponding to the opening 303 of the resist mask 302 is removed by etching and an indentation 155 is formed on the surface of the semiconductor film 100.

Next, laser annealing (crystallization process) is performed by irradiating a laser beam on the semiconductor film 100 as described in FIG. 2(D). This crystallization process is accomplished by irradiating a line beam L0 on the semiconductor film 100 and by shifting its irradiation region L towards Y-direction as described in reference to FIG. 15, for example.

Here, the annealing conditions of the line beam L0 such as energy density, focus position, irradiation time and irradiation frequency are set in such a manner that optimum crystallization occurs in all the sections of the semiconductor 100 except for the indentation 155. Hence, optimum crystallization occurs in all regions of the semiconductor film 100 except for the indented region 155, but in the region corresponding to the indentation 155 the laser annealing conditions are shifted from the optimum conditions. For this reason, the degree of crystallization is low in the section corresponding to the indentation 155. In the present embodiment, the recombination center 150 is formed utilizing the fact that the degree of crystallization is low and defects are concentrated in the indentation 155.

After forming the recombination center 150 in this manner, an island-like pattern is made on the polycrystal semiconductor film 100 using a photolithography technique as described in FIG. 2 (E).

Next, a gate insulation film 12 consisting of silicon oxide film of a width of 600 angstroms to 1500 angstroms is formed on the surface side using raw gas of TEOS (tetraetoxynesilane) or oxygen gas by means of the plasma CVD method as described in FIG. 3 (A).

Next, a conductive film 140 containing aluminum, tantalum, molybdenum, titanium, tungsten, etc., is formed by means of a sputter method as described in FIG. 3 (B).

Then, the gate electrode 14 is formed by patterning the conductive film 140 after forming the resist mask 301 on the surface of the conductive film 140 as described in FIG. 3 (D).

Next, phosphate ions with a dosage of about $1 \times 10^{15}$ cm$^{-2}$ is placed into the semiconductor film 100 using the gate electrode 14 as a mask as described in FIG. 3 (E). As a result, the highly concentrated source region 16 and the drain region 17 with an impurity concentration of about $10^{20}$ cm$^{-3}$ are formed in the semiconductor film 100 in such a manner that they are self-aligned with respect to the gate electrode 14. Here, the section to which impurity is not introduced out of entire region of the semiconductor film 100 becomes the channel region 15.

Next, annealing for activation is performed under a temperature condition of below 400° C. or below 300° C. preferably, after formation of the inter-layer insulation film on the surface side of the gate electrode 14, as described in FIG. 1. Then, the source electrode 41 and the drain electrode 42 are formed after formation of contact holes in the inter-layer insulation film 52. As a result, TFT 10 is formed.

In this manner, the method for manufacturing of TFT 10 in the present embodiment enables the formation of the recombination center 150 with a low degree of crystallization for the predetermined region of the semiconductor film 100 by performing laser annealing under the conditions in which the surface of the semiconductor film 100 is partially indented and a section with partially different film thickness is formed. Hence, production of TFT 10 having the recombination center 150 in the predetermined region of the channel 15 is enabled using the same processes as the methods for manufacturing of prior art after the previous step.

Moreover, in the present embodiment, once laser annealing which combines the (crystallization process for the semiconductor film 100 and the formation of the recombination center for forming the channel region 15 is performed, the semiconductor film 100 will not be exposed to a high temperature environment, for example a temperature higher than 400° C. (preferably 300° C.). Hence, in the semiconductor film 100 (channel region 15), the section being formed as the recombination center 150 may not be crystallized due to subsequent heat treatment or defects of the recombination center 150 may not be repaired.

Embodiment 2

Figure 4:
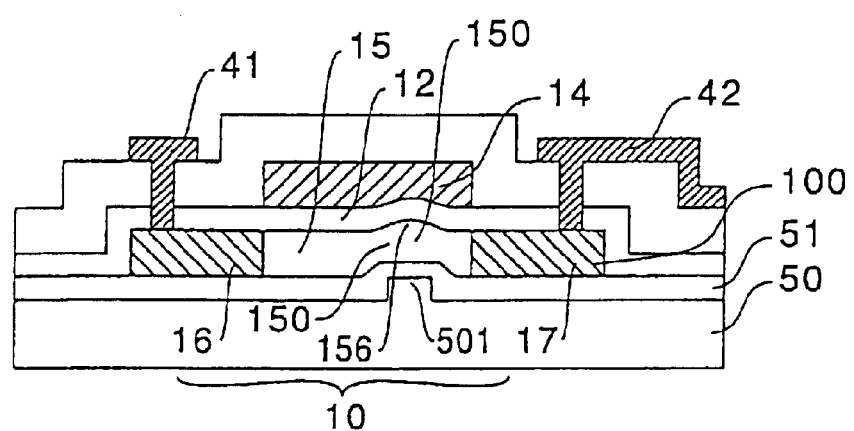

FIG. 4 is a cross-section illustrating a typical structure of TFT in embodiment 2 of the present invention.

In the present embodiment also, a bottom layer protection film 51 made of silicon oxide film is formed on the surface side of the substrate 50, and an N-type TFT 10 is formed on the surface of the bottom layer protection film 51, as described in FIG. 4. Semiconductor film 100 consisting of polycrystal silicon film with an island-like pattern is formed on the surface of the bottom layer protection film 51. A gate insulation film 12 consisting of the silicon oxide film or silicon nitride film is formed on the surface of the semiconductor film 100, and the gate electrode 14 is formed on the surface of the gate insulation film 12. A channel region 15 facing the gate electrode 14 through the gate insulation film 12 is formed in the semiconductor film 100. A highly concentrated source region 16 and drain region 17 which are self aligned with respect to the electrode 14 are formed on the sides of the channel region 15. The source electrode 41 and the drain electrode 42 are electrically connected to the source region 16 and the drain region 17 respectively through contact holes in the inter-layer insulation film 52 consisting of a silicon oxide film.

Here, partially bulged section 156 is formed on the surface of the channel region 15 out of the surface of the semiconductor film 100. The bulged section 156 is a reflection of the bulged section 501 being formed on the side of the substrate 50 to the surface of the semiconductor film 100. Hence, in the present embodiment, the film thickness of the semiconductor film 100 is uniform in spite of the formation of the bulged section 156 on the surface of the semiconductor film 100.

The section corresponding to the bulged section 156 in the channel region 15 of the TFT 10 thus structured becomes the recombination center 150 which captures the small-number carrier, having a lower degree of crystallization than other regions in the channel 15. In the present embodiment, the recombination center 150 is concentrated at a position closer to the drain region 17 in the channel region 15. In other words, the recombination center 150 is concentrated at the position whose distance from the drain region 17 is equivalent to ⅓ to 1/10 of the channel distance.

The density of the recombination center 150 in the present embodiment is in the range of $1 \times 10^{13}$ cm$^{-3}$ to $1 \times 10^{20}$ cm$^{-3}$, and the carrier capture cross section of the recombination center 150 is in the range of $1 \times 10^{-13}$ cm$^{2}$ to $1 \times 10^{-20}$ cm$^{2}$. Such density and carrier capture cross section of the recombination center 150 may be controlled by how far the degree of crystallization is lowered in the production method, which will be explained later.

Moreover, even in TFT 10 thus structured, as the drain voltage increases sufficiently close to the gate voltage, a pair of a hole and an electron is generated by the hot carrier. The hole being generated in the present embodiment recombines and is captured at the recombination center 150. Thus, most of the holes being generated disappear in the channel region 15 and the electric potential the channel region 15 does not rise. Hence, the threshold voltage does not drop. Moreover, a phenomena in which electrons are placed from the source region 16 to the channel region 15 by holes being placed from the channel region 15 to the source region 16 does not occur because the channel region 15 does not reach an electric potential strong enough to place holes in the source region 16. Hence, in TFT 10 of the present embodiment, a kink effect in which drain current increases greatly and the occurrence of bipolar action in a saturated region may be controlled as described by dotted line L2 and broken line L3 in FIG. 18. Hence, even if a degree of crystallization of semiconductor film 100 is raised to improve the on-current level, the TFT itself or circuits in the vicinity thereof will not be destroyed by excess current, resulting in an improvement in reliability.

A method for manufacturing of TFT 10 thus structured will be described in reference to FIG. 4, FIG. 5 and FIG. 6. Both FIG. 5 and FIG. 6 are process cross-sections illustrating the method for manufacturing of TFT of the present embodiment.

Figure 5A:
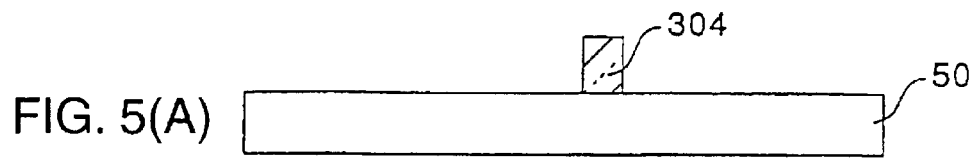

In the present embodiment, a substrate 50 made of glass, and such which is cleansed by ultrasonic cleaning, etc. is first prepared as described in FIG. 5(A).

Next, a photo resist mask 304 is formed on the surface of the substrate 50 using a photolithography technique. The photo resist mask 304 covers the section equivalent to the bulged section 501 which was explained in reference to FIG. 4.

Next, light etching is performed on the surface of the substrate 50 with a condition in which the photo resist mask 304 is formed, after which the photo resist mask 304 is removed. The amount of etching at this time is to be 200 angstroms to 2,000 angstroms.

Figure 5B:
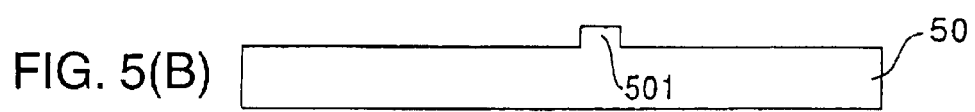

As a result, the entire surface of the substrate 50 except for the section being covered by the photo resist mask 304 is etched, and the section being covered by the photo resist mask 304 becomes a bulged section 501 as described in FIG. 5(B).

Figure 5C:
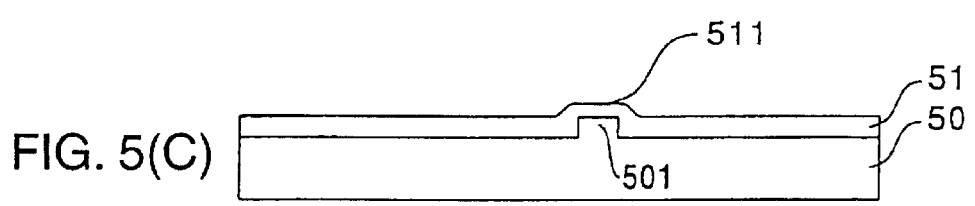
Figure 5D:
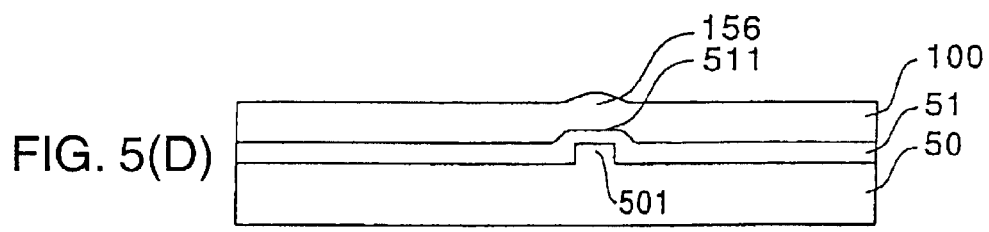

Next, a bottom layer protection film 51 consisting of silicon oxide film of a thickness of 2000 angstroms to 5000 angstroms is formed over the entire surface of the substrate 50 under a substrate temperature condition of about 150° C. to about 450° C. using the plasma CVD method as shown in FIG. 5(C). The bulged section 501 on the surface of the substrate 50 is reflected as the bulged section 511 on the surface of the bottom layer film 51.

Next, the semiconductor film 100 is formed on the substrate 50. As a result, the bulged section 501 of the substrate 50 is reflected on the surface of the semiconductor film 100 and the bulged section 156 is formed as described in FIG. 5(D). At this time, a low temperature process is used to prevent heat deformation of the glass substrate 50. In short, the semiconductor film 100 consisting of a non-crystal silicon film of thickness between 300 angstroms to 700 angstroms is formed on the entire surface of the substrate 50 under the substrate temperature condition of about 150° C. to about 450° C. using the plasma CVD method.

Figure 5E:
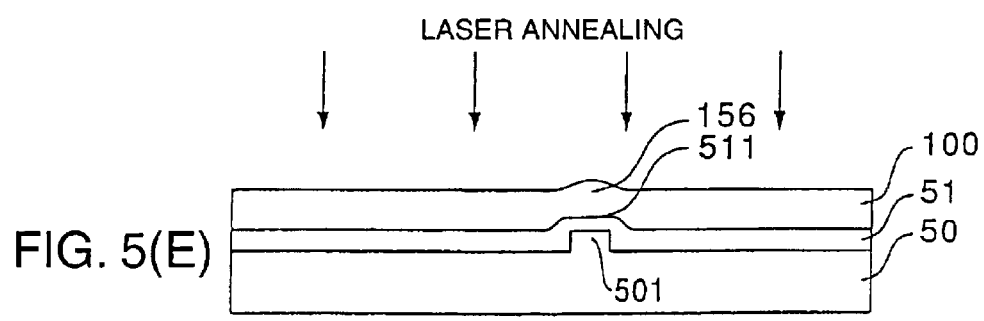
Figure 5F:
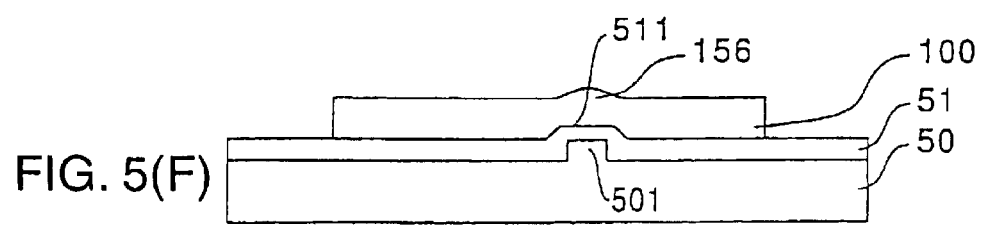
Figure 6A:
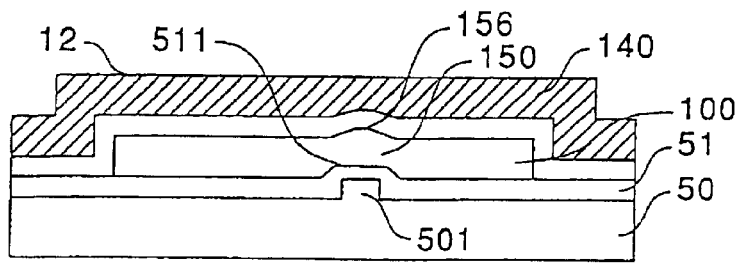
Figure 6B:
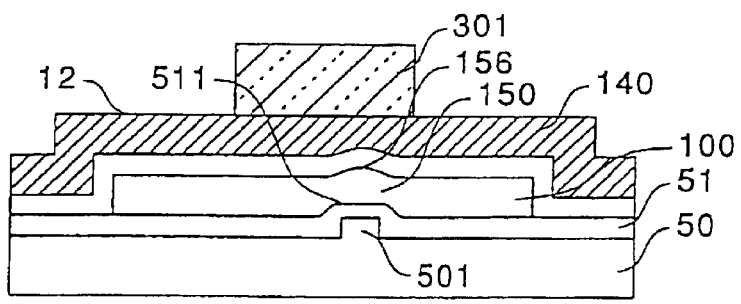
Figure 6C:
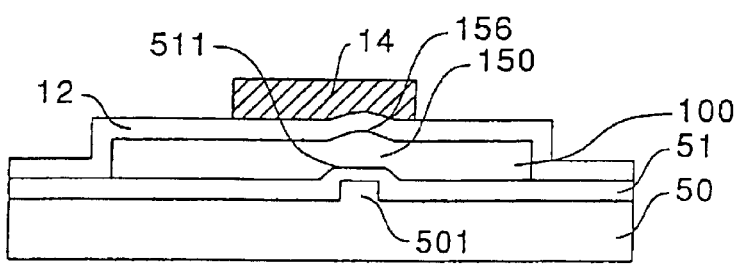
Figure 6D:
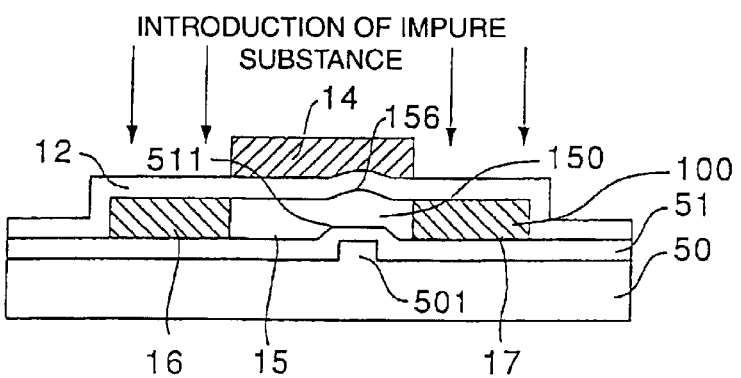

Next, laser annealing (crystallization process) is performed by irradiating a laser beam on the semiconductor film 100 as shown in FIG. 5(E). This crystallization process is accomplished by an irradiating line beam L0 on the semiconductor film 100 and by shifting its irradiation region L towards the Y-direction as described in reference to FIG. 15, for example.

Here, the energy density, focus position, irradiation time and irradiation frequency of the line beam L0 are set in such a manner that optimum crystallization occurs in all the sections of the semiconductor 100 except for the bulged section 156. Hence, such crystallization occurs, but in the bulged region 156 the laser annealing conditions are shifted from the optimum conditions by the amount of difference in height of the surface from the neighborhood. For this reason, the degree of crystallization is low in the section corresponding to the bulged section 156. In the present embodiment, the recombination center 150 is formed utilizing the fact that the degree of crystallization is low and defects are concentrated in the bulged section 156.

After forming the recombination center 150 in this manner, an island-like pattern is made on the polycrystal semiconductor film 100 using a photolithography technique as described in FIG. 5 (F).

Next, a gate insulation film 12 consisting of silicon oxide film of a width of 600 angstroms to 1500 angstroms is formed on the surface side using raw gas of TEOS (tetraetoxynesilane) or oxygen gas by means of a plasma CVD method as described in FIG. 6 (A).

Next, a conductive film 140 containing aluminum, tantalum, molybdenum, titanium, tungsten, and the like is formed by means of a sputter method as described in FIG. 6 (B).

Then, the gate electrode 14 is formed by patterning the conductive film 140 after forming the resist mask 301 on the surface of the conductive film 140 as described in FIG. 6 (C).

Next, phosphate ions with a dosage of about $1\times10^{15}$ cm$^{-2}$ are placed into the semiconductor film 100 using the gate electrode 14 as a mask. As a result, the highly concentrated source region 16 and the drain region 17 with an impurity concentration of about $10^{20}$ cm$^{-3}$ are formed in the semiconductor film 100 in such a manner that they are self-aligned with respect to the gate electrode 14. Here, the section to which impurites are not introduced out of entire region of the semiconductor film 100 becomes the channel region 15.

Next, annealing for activation is performed under temperature conditions of below 400° C. or preferably below 300° C., after there is formation of the inter-layer insulation film on the surface side of the gate electrode 14, as described in FIG. 4. Then, the source electrode 41 and the drain electrode 42 are formed after formation of contact holes in the inter-layer insulation film 52. As a result, TFT 10 is formed.

In this manner, the method for manufacturing of TFT 10 in the present embodiment enables the formation of the recombination center 150 with a low degree of crystallization for the predetermined region of the semiconductor film 100 by performing laser annealing under the conditions in which the surface of the semiconductor film 100 is partially bulged and a section with a partially different film thickness is formed. Hence, production of TFT 10 having the recombination center 150 in the predetermined region of the channel 15 is enabled using the same processes as with the methods for manufacturing of the prior art after the previous step.

Moreover, in the present embodiment, once laser annealing which combines the crystallization process for the semiconductor film 100 and the formation of recombination center for forming the channel region 15 is performed, the semiconductor film 100 will not be exposed to a high temperature environment, for example, a temperature higher than 400° C. (preferably 300° C.). Hence, in the semiconductor film 100 (channel region 15), the section being formed as the recombination center 150 may not be crystallized due to subsequent heat treatment or defects of the recombination center 150 may not be repaired.

Modification of Embodiment 2

Figure 7A:
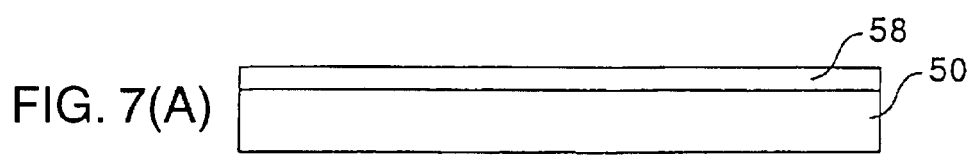
Figure 7B:
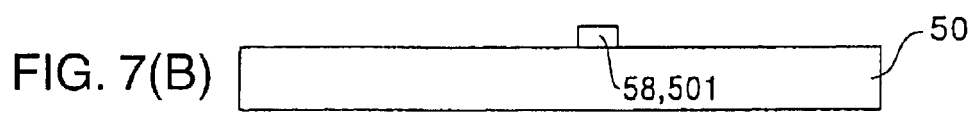
Figure 7C:
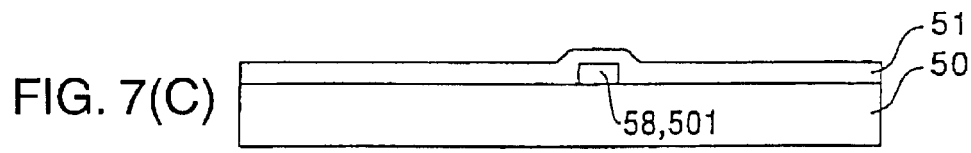
Figure 7D:
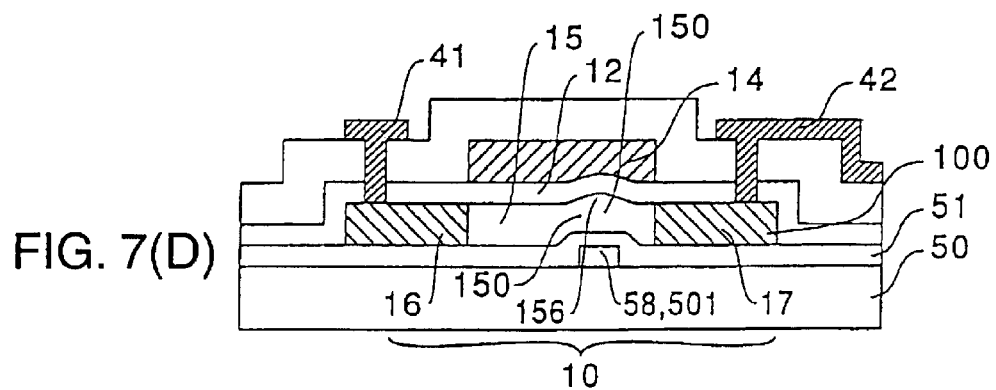

Here, a bottom layer protection film may be made to have double layer structure, the lower layer of which may have a structure having a partially remaining bottom layer protection film as a method to form a bulged section 156 on the surface of the semiconductor film 100 using the bulged section being formed on the lower layer side of the semiconductor film 100, which will be explained below. In short, after forming the bottom layer protection film 58 on the side of the lower layer of the surface of the substrate 50 as shown in FIG. 7(A), patterning is performed on the lower layer side bottom layer protection film 58, leaving only part of the lower layer side bottom layer protection film 58 as shown in FIG. 7(B), and the bulged section 501 may be formed on the side of the substrate 50. Hence, if the same process as in the aforementioned method is performed subsequently such as forming a bottom layer protection film 51 on the side of the upper layer as described in FIG. 7(C), followed by forming the semiconductor film 100 as described in FIG. 7(D), TFT 100 may be formed using a semiconductor film 100 having the bulged section 156 on the surface. Here, other structures are the same as the embodiment 2, hence the parts in FIG. 7(D) corresponding to the parts in embodiment 2 will be identified with the same symbol and the explanation of these parts will be omitted.

Embodiment 3

Figure 8:
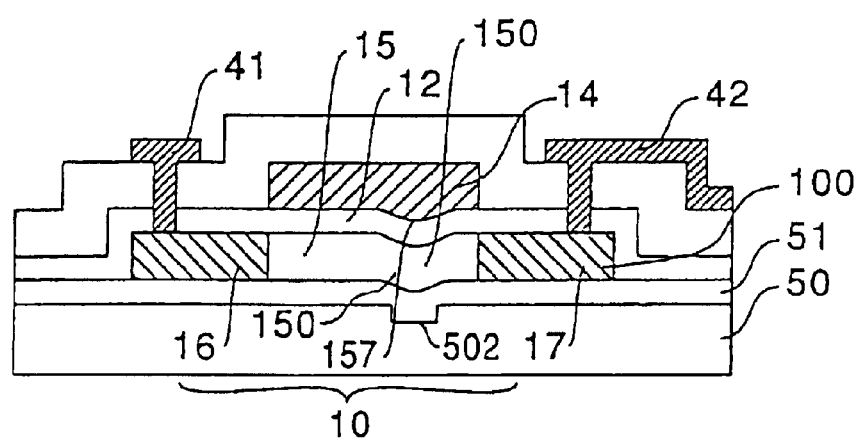

FIG. 8 is a cross-section illustrating a typical structure of TFT in embodiment 3 of the present invention.

Also in the present embodiment, a bottom layer protection film 51 made of silicon oxide film is formed on the surface side of the substrate 50, and an N-type TFT 10 is formed on the surface of the bottom layer protection film 51, as described in FIG. 8. Semiconductor film 100 consisting of polycrystal silicon film with an island-like pattern is formed on the surface of the bottom layer protection film 51. A gate insulation film 12 consisting of silicon oxide film or silicon nitride film is formed on the surface of the semiconductor film 100, and the gate electrode 14 is formed on the surface of the gate insulation film 12. A channel region 15 facing the gate electrode 14 through the gate insulation film 12 is formed in the semiconductor film 100. A highly concentrated source region 16 and drain region 17 which are self aligned with respect to the electrode 14 are formed on the sides of the channel region 15. The source electrode 41 and the drain electrode 42 are electrically connected to the source region 16 and the drain region 17 respectively through contact holes in the inter-layer insulation film 52 consisting of a silicon oxide film.

Here, a partially indented section 157 is formed on the surface of the channel region 15 out of the entire surface of the semiconductor film 100. The indented section 157 is a reflection of the indented section 502 being formed on the side of the substrate 50 to the surface of the semiconductor film 100. Hence, in the present embodiment, the film thickness of the semiconductor film 100 is uniform in spite of the formation of the indented section 157 on the surface of the semiconductor film 100.

The section corresponding to the indented section 157 in the channel region 15 of the TFT 10 thus structured becomes the recombination center 150 which captures a small-number carrier, having a lower degree of crystallization than other regions in the channel 15. In the present embodiment, the recombination center 150 is concentrated at the position closer to the drain region 17 in the channel region 15. In other words, the recombination center 150 is concentrated at the position whose distance from the drain region 17 is equivalent to ⅓ to ¹⁄₁₀ of the channel distance.

The density of the recombination center 150 in the present embodiment also is in the range of $1\times10^{13}$ cm$^{-3}$ to $1\times10^{20}$ cm$^{-3}$, and the carrier capture cross section of the recombination center 150 is in the range of $1\times10^{-13}$ cm$^2$ to $1\times10^{-20}$ cm$^2$. Such density and carrier capture cross section of the recombination center 150 may be controlled by how far the degree of crystallization is lowered in the production method, which will be explained later.

Moreover, even in TFT 10 thus structured, as the drain voltage increases sufficiently close to the gate voltage, a pair of a hole and an electron is generated by the hot carrier. The hole being generated in the present embodiment recombines and is captured at the recombination center 150. Thus, most of the holes being generated disappear in the channel region 15 and the electric potential of the channel region 15 does not rise. Hence, in TFT 10 of the present embodiment, the kink effect in which drain current increases greatly and occurrence of bipolar action in the saturated region may be controlled as described by dotted line L2 and broken line L3 in FIG. 18. Hence, even if the degree of crystallization of semiconductor film 100 is raised to improve the on-current level, the TFT itself or circuits in the vicinity thereof will not be destroyed by excess current, resulting in an improvement in reliability.

A method for manufacturing of a TFT 10 thus structured will be described with reference to FIG. 8, FIG. 9 and FIG. 10. Both FIG. 9 and FIG. 10 are process cross-sections illustrating the method for manufacturing of the TFT of the present embodiment.

Figure 9A:
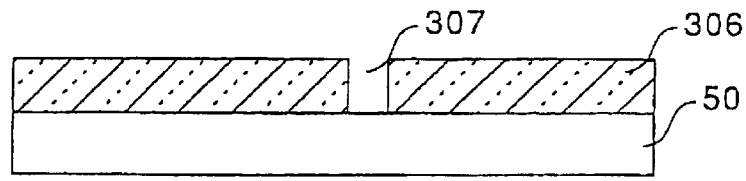

In the present embodiment, a substrate 50 made of glass, and the like which is cleansed by ultrasonic cleaning, or such is first prepared as described in FIG. 9(A).

Next, photo resist mask 306 is formed on the surface of the substrate 50 using a photolithography technique. The photo resist mask 306 has an opening 307 equivalent to the indented section 502 which was explained with reference to FIG. 8.

Next, light etching is performed on the surface of the substrate 50 with a condition in which the photo resist mask 306 is formed, after which the photo resist mask 306 is removed. The amount of etching at this time is to be 200 angstroms to 2,000 angstroms.

Figure 9B:
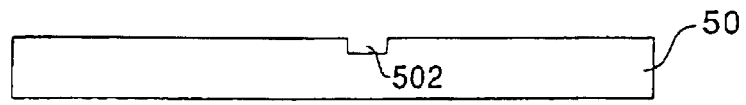

As a result, the indented section 502 is formed on the surface of the substrate 50 as shown in FIG. 9(B).

Figure 9C:
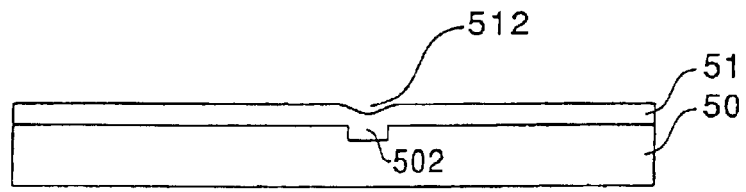

Next, a bottom layer protection film 51 consisting of a silicon oxide film of a thickness of 2000 angstroms to 5000 angstroms is formed over the entire surface of the substrate 50 under a substrate temperature condition of about 150° C. to about 450° C. using the plasma CVD method as shown in FIG. 9(C). The indented section 502 on the surface of the substrate 50 is reflected and the indented section 512 is formed on the surface of the bottom layer film 51.

Figure 9D:
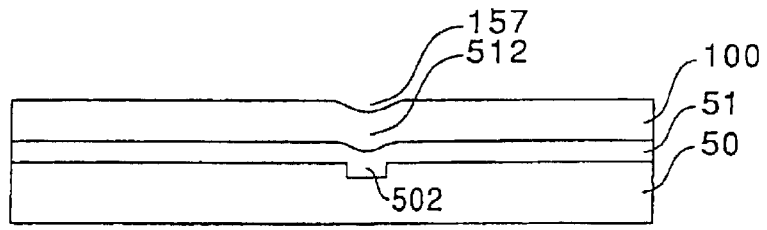

Next, the semiconductor film 100 is formed on the substrate 50. As a result, the indented section 502 of the substrate 50 is reflected on the surface of the semiconductor film 100 and the indented section 157 is formed as shown in FIG. 9(D). At this time, a low temperature process is used to prevent heat deformation of the glass substrate 50. In short, the semiconductor film 100 consisting of a non-crystal silicon film of a thickness between 300 angstroms to 700 angstroms is formed on the entire surface of the substrate 50 under the substrate temperature condition of about 150° C. to about 450° C. using the plasma CVD method.

Figure 9E:
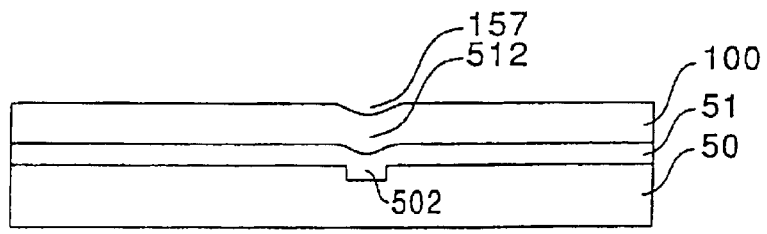
Figure 9F:
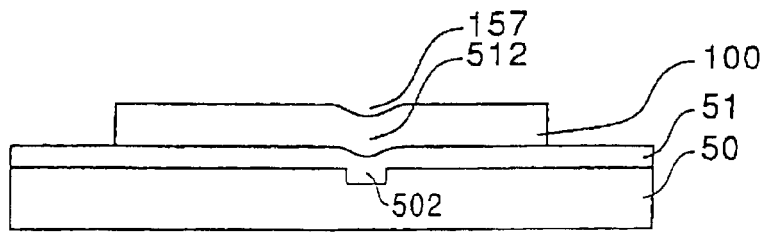
Figure 10A:
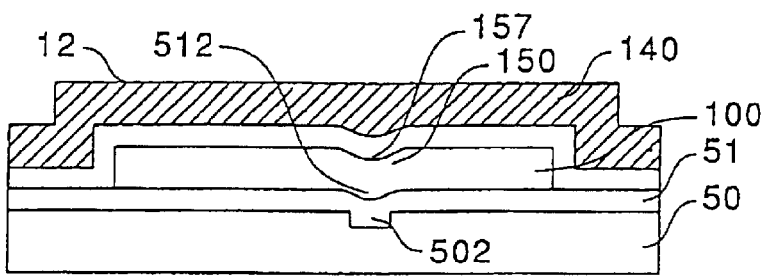
Figure 10B:
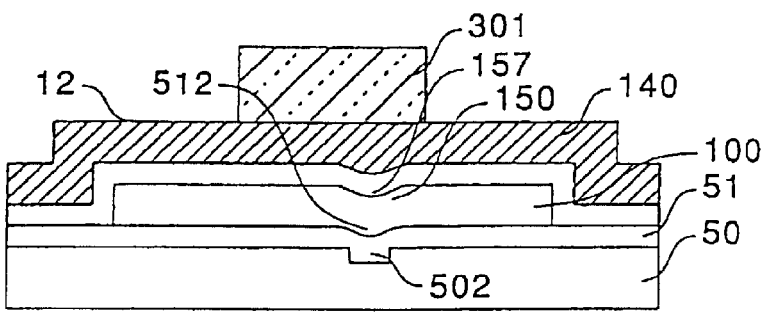
Figure 10C:
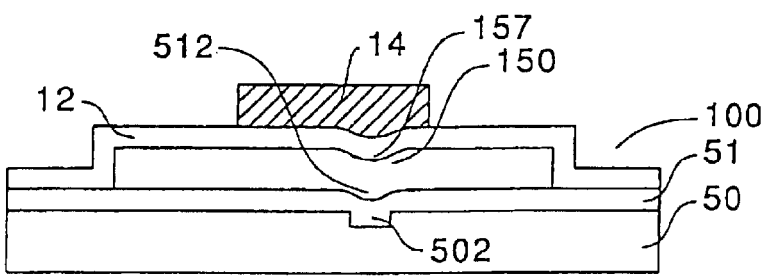
Figure 10D:
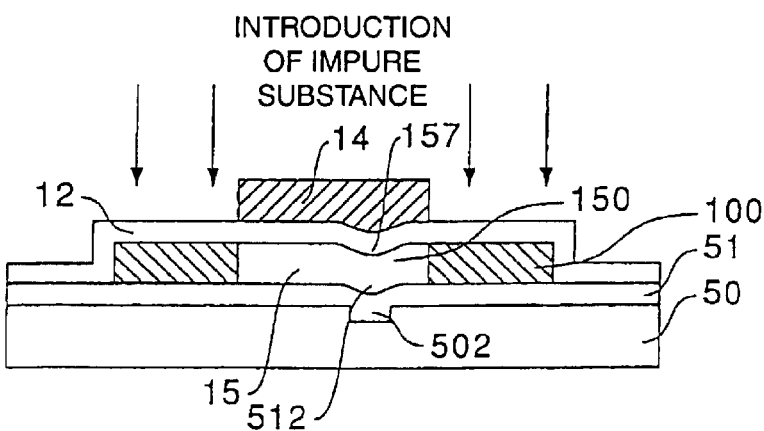

Next, laser annealing (crystallization process) is performed by irradiating a laser beam on the semiconductor film 100 as described in FIG. 9(E). This crystallization process is accomplished by irradiating a line beam L0 on the semiconductor film 100 and by shifting its irradiation region L towards Y-direction as described in reference to FIG. 15, for example.

Here, the energy density, focus position, irradiation time and irradiation frequency of the line beam L0 are set in such a manner that optimum crystallization occurs in all the sections of the semiconductor 100 except for the indented section 157. Hence, such crystallization occurs, but in the indented region 157 the laser annealing conditions are shifted from the optimum conditions, and the degree of crystallization is low. In the present embodiment, the recombination center 150 is formed utilizing the fact that the degree of crystallization is low and defects are concentrated in the indented section 157.

After forming the recombination center 150 in this manner, an island-like pattern is made on the polycrystal semiconductor film 100 using a photolithography technique as described in FIG. 9 (F).

Next, a gate insulation film 12 consisting of silicon oxide film of a width of 600 angstroms to 1500 angstroms is formed on the surface side using raw gas of TEOS (tetraetoxynesilane) or oxygen gas by means of plasma CVD method as shown in FIG. 10 (A).

Next, a conductive film 140 containing aluminum, tantalum, molybdenum, titanium, tungsten, etc., is formed by means of the sputter method also as shown in FIG. 10 (A).

Then, the gate electrode 14 is formed by patterning the conductive film 140 after forming the resist mask 301 on the surface of the conductive film 140 as shown in FIGS. 10 (B) and (C).

Next, phosphate ions with a dosage of about $1 \times 10^{15}$ cm$^{-2}$ are placed into the semiconductor film 100 using the gate electrode 14 as a mask. As a result, the highly concentrated source region 16 and the drain region 17 with an impurity concentration of about $10^{20}$ cm$^{-3}$ are formed in the semiconductor film 100 in such a manner that they are self-aligned with respect to the gate electrode 14. Here, the section to which impurities are not introduced out of entire region of the semiconductor film 100 becomes the channel region 15.

Next, annealing for activation is performed under temperature conditions of below 400° C. or preferably below 300° C., after formation of the inter-layer insulation film on the surface side of the gate electrode 14, as described in FIG. 4. Then, the source electrode 41 and the drain electrode 42 are formed after formation of contact holes in the inter-layer insulation film 52. As a result, a TFT 10 is formed.

In this manner, the method for manufacturing of TFT 10 in the present embodiment enables the formation of a recombination center 150 with a low degree of crystallization for the predetermined region of the semiconductor film 100 by performing laser annealing under the conditions in which the surface of the semiconductor film 100 is partially indented as the indented section 157. Hence, production of TFT 10 having the recombination center 150 in the predetermined region of the channel 15 is enabled using the same process as production methods of the prior art after the previous step.

Moreover, in the present embodiment, once laser annealing which combines the crystallization process for the semiconductor film 100 and formation of the recombination center for forming the channel region 15 is performed, the semiconductor film 100 will not be exposed to a high temperature environment, for example, a temperature higher than 400° C. (preferably 300° C.). Hence, in the semiconductor film 100 (channel region 15), the section being formed as the recombination center 150 may not be crystallized due to subsequent heat treatment or defects of the recombination center 150 may not be repaired.

Modification of Embodiment 3

Figure 11A:
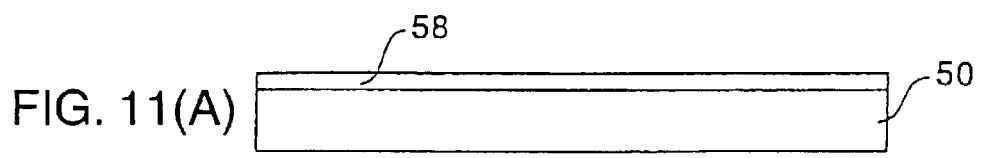
Figure 11B:
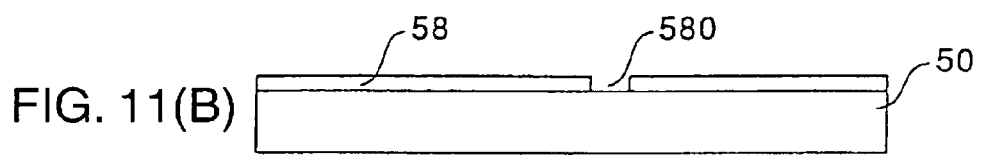
Figure 11C:
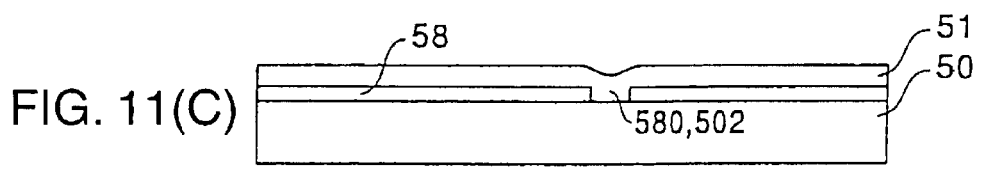
Figure 11D:
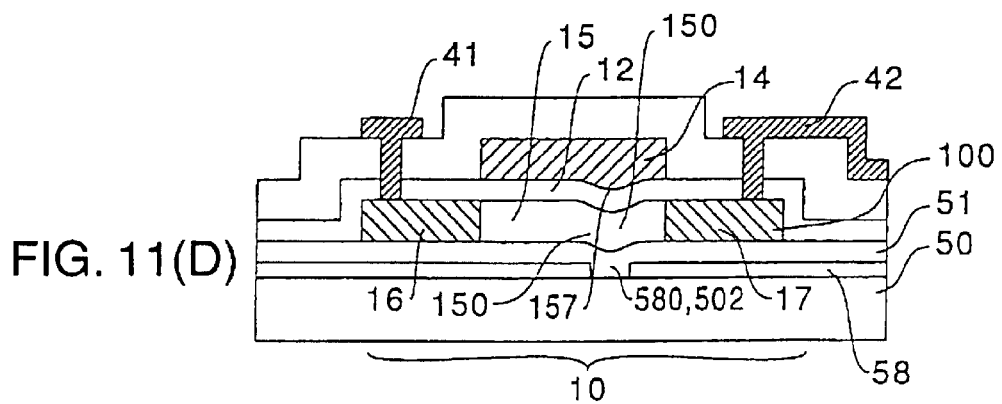
Figure 12A:
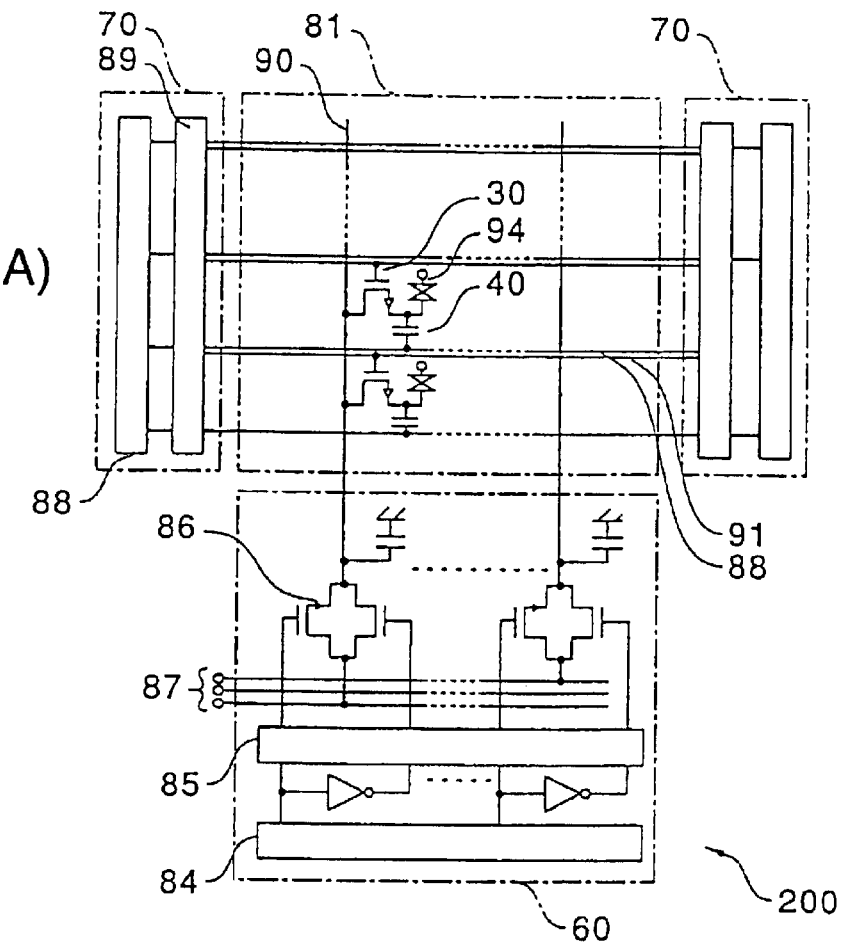
FIG. 12(A) is a block diagram of the active matrix substrate used in the liquid crystal display apparatus, and (B) is an equivalent value circuit diagram of the CMOS circuit which composes the driving circuit.
Figure 12B:
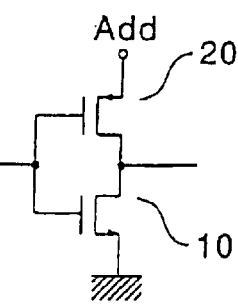

Here, a bottom layer protection film may be made to have a double layer structure, and a hole formed on the lower layer of the bottom layer protection film may be used as a method to form an indented section 157 on the surface of the semiconductor film 100 using a hole being formed on the lower layer side of the semiconductor film 100, which will be explained below. In short, after forming the bottom layer protection film 58 on the side of lower layer of the surface of the substrate 50 as shown in FIG. 11 (A), patterning is performed to form a hole 580 on the protection film 58 as shown in FIG. 11(B). Using the hole 580, the indented section 502 is formed on the side of the substrate 50. Hence, if the same process as in the aforementioned method is performed subsequently such as forming a bottom layer protection film 51 on the side of the upper layer as shown in FIG. 11(C), followed by forming the semiconductor film 100 as shown in FIG. 11(D), a TFT 100 may be formed using the semiconductor film 100 having the indented section 157 on the surface. Here, other structures are same as embodiment 3, hence the parts in FIG. 11(D) corresponding to the parts in the embodiment 3 will be identified with the same symbol and the explanation of these parts will be omitted.

Other Embodiments

In each of aforementioned embodiments, an example in which the present invention is applied to a top-gate type TFT is explained, but the present invention may be applied to a bottom-gate type TFT.

Efficacy of the Invention

In the present invention, even if a hole and an electron are generated by hot carriers due to increase in drain voltage in an N-type TFT, the hole and an electron are recombined at the recombination center formed in the channel region, hence, the electric potential in the channel region does not increase, as explained before. Hence, the threshold voltage does not change. Moreover, holes are never placed from the channel region to the source region, hence, the placement of electrons from the source range to the drain range caused by the placement of such holes do not occur. For this reason, an increase in the drain current (saturation current) with an increase of drain voltage may be controlled in the saturation region. Hence, even if the on-current characteristics is improved by increasing the degree of the crystallization of the semiconductor film, destruction of thee TFT itself and circuits in the vicinity thereof is avoided, resulting in increased reliability.

What is claimed is:

1. A thin film transistor, comprising:
   a gate electrode having a gate insulation film;
   a channel region that extends through the gate insulation film in the gate electrode; and
   source drain regions connected to said channel region that are formed against a semiconductor film that is formed on the surface of an insulation substrate, wherein a recombination center which captures carriers is formed in said channel region by part of a crystal semiconductor film having a relatively low degree of crystallization in crystal semiconductor film that forms said channel region.

2. The thin film transistor of claim 1, wherein said recombination center is concentrated adjacent to said drain regions within said channel region.

3. The thin film transistor of claim 2, wherein said recombination center is concentrated in a region, among channel regions, whose distance from the drain regions is equivalent to $\frac{1}{3}$ to $\frac{1}{10}$ of a channel length.

4. The thin film transistor according to claim 3, wherein the region, in said channel region, in which said recombination center is concentrated has different film thickness compared to other regions.

5. The thin film transistor according to claim 3, wherein the region, in said channel region, in which said recombination center is concentrated have different surface positions compared to other regions.

6. The thin film transistor according to claim 2, wherein a region, in said channel region, in which said recombination center is concentrated have different film thickness compared to other regions.

7. The thin film transistor according to claim 2, wherein the region, in said channel region, in which said recombination center is concentrated has different surface positions compared to other regions.

8. The thin film transistor according to claim 1, wherein a region, in said channel region, in which said recombination center is concentrated has different film thickness compared to other region.

9. The thin film transistor according to claim 1, wherein a region, in said channel region, in which said recombination center is concentrated has different surface positions compared to other regions.

10. The thin film transistor of claim 9, wherein the region, in said channel region, in which said recombination center is concentrated has different surface height positions compared to other regions due to a different thickness of the semiconductor film forming said channel region.

11. The thin film transistor of claim 9, wherein the region, in said channel region, in which said recombination center is concentrated has different surface height positions compared to other regions due to the formation of at least one of indented sections and bulged sections in a lower layer of the semiconductor films forming said channel regions.

12. A display device having a thin film transistor, the thin film transistor comprising:

a gate electrode having a gate insulation film;

a channel region that extends through the gate insulation film in the gate electrode; and source drain regions connected to said channel regions that are formed against a semiconductor film that is formed on the surface of an insulation substrate, wherein a recombination center which capture carriers is formed in said channel region by part of crystal semiconductor films having a relatively low degree of crystallization among crystal semiconductor films that form said channel region.

* * * * *